United States Patent [19]

Fromson et al.

[11] Patent Number: 4,501,810
[45] Date of Patent: Feb. 26, 1985

[54] LITHOGRAPHIC PRINTING PLATE WITH RESIN REINFORCED IMAGE AND PROCESS

[75] Inventors: Howard A. Fromson, 15 Rogues Ridge Rd., Weston, Conn. 06880; Robert F. Gracia, Woodstock, Conn.

[73] Assignee: Howard A. Fromson, Rockville, Conn.

[21] Appl. No.: 471,621

[22] Filed: Mar. 3, 1983

Related U.S. Application Data

[63] Continuation of Ser. No. 307,335, Sep. 30, 1981, abandoned.

[51] Int. Cl.³ .............................................. G03F 7/02
[52] U.S. Cl. ..................................... 430/302; 430/17; 430/18; 430/330; 430/331; 430/278; 430/291; 430/155; 430/144; 430/273; 430/162; 430/146
[58] Field of Search ................... 430/302, 17, 18, 146, 430/330, 331, 278, 291, 155, 162, 144, 273

[56] References Cited

U.S. PATENT DOCUMENTS

| | | | |
|---|---|---|---|
| 3,091,533 | 5/1963 | Hodgins | 430/331 |
| 3,136,637 | 6/1964 | Larson | 430/302 |
| 4,186,006 | 1/1980 | Kobayashi et al. | 430/302 |
| 4,272,604 | 6/1981 | Meador et al. | 430/302 |
| 4,391,897 | 7/1983 | Gracia et al. | 430/302 |
| 4,414,315 | 11/1983 | Gracia et al. | 430/302 |

*Primary Examiner*—Won H. Louie
*Attorney, Agent, or Firm*—Felfe & Lynch

[57] ABSTRACT

The lithographic printing plate of the invention comprises a substrate having a hydrophilic surface, a coating on said surface of a light sensitive material (e.g., a water soluble diazo) and a top coating of discrete, oleophilic resin particles (e.g., an emulsion polymer), the resin particle coating being:

(a) transparent to actinic light;
(b) sufficiently permeable to allow a developer for the light sensitive material to penetrate through to the underlying light sensitive coating;
(c) insoluble in said developer;
(d) capable of being coalesced in situ after the plate is imaged and developed.

8 Claims, No Drawings

4,501,810

LITHOGRAPHIC PRINTING PLATE WITH RESIN REINFORCED IMAGE AND PROCESS

This is a continuation of U.S. patent application Ser. No. 307,335, filed Sept. 30, 1980, now abandoned.

BACKGROUND

This invention relates to improved lithographic printing plates with a resin reinforced image and to a process for making such plates.

In the art of lithographic printing plates, there are many options for producing an image useful for printing. These include an additive, one-step resin reinforced image, a substractive, photo-polymer image, a substractive diazo-resin reinforced image, a substractive photopolymer on diazo image, an additive, one-step reinforced image post cured with heat, a substractive diazo image, photo-polymer image reinforced and post exposed, bi-metal and trimetal plates, and resin particles in a diazo matrix.

A problem associated with these plate systems has been the durability of developed images. While offset lithography represents one of the most widely practiced of the printing arts, it is nevertheless generally limited to applications where relatively short press runs are acceptable. This is due principally to the abrasive action of the pigments employed in offset inks coupled with the physical interaction between the blanket cylinder and the plate master cylinder which results in relatively rapid wear of the olephilic image areas of the printing plate. Thus, conventional photolithography while highly desirable in many respects does not compete effectively with letterpress printing for large volume printing applications. Early efforts directed towards solving this problem involved reinforcing the image after it was developed by applying a durable coating in the image areas. However, such coatings had to be applied properly, skillfully and uniformly and failure to achieve any of these led to undesirable and often disastrous results. This prompted the development set forth in U.S. Pat. No. 3,136,637, Larson, June 9, 1964, of presensitized structures having a water-insoluble solvent-softenable polymer coating over the entire light-sensitive layer. After exposure to actinic light, the portions of the polymer coating overlying the soluble unexposed portions of the light-sensitive layer are removed with a suitable solvent and the soluble portions of the light-sensitive layer are removed with a second solvent which is generally water.

Another earlier approach involving coating the entire light-sensitive layer before imaging is set forth in U.S. Pat. No. 1,992,965, Rowell, Mar. 5, 1935. Here, however, a film of waxy material is applied in thicknesses of two or three ten thousandths of an inch to maintain and preserve the actinic sensitivity and surface continuity of chromated colloid films. This waxy film preservative, which is actually less durable than the chromated colloid film, is removed with a solvent after exposure to actinic light so that the colloid can be developed with water or is made water-permeable by laying down a wax emulsion and removing the water. In the latter instance, water passes through the waxy film and removes the soluble portions of the colloid film as well as the overlying portions of the waxy film. This is undesirable because it leaves less durable wax over the more durable image areas of the colloid film.

Later efforts involved a protective layer over the light-sensitive layer which is permeable to solvents used to develop an imaged plate. See U.S. Pat. No. 3,773,514, issued Nov. 20, 1973, and U.S. Pat. No. 3,839,037, issued Oct. 1, 1974. The protective layer is a very thin layer of metal or metal compound which is vacuum deposited. This was also used to improve vacuum metalized articles. See U.S. Pat. No. 3,775,157, issued Nov. 27, 1973.

One of the major problems in current lithographic plate systems is the difficulty in toughening the image area without resorting to toxic, complex solvent systems. For example: most additive systems resort to heterocyclic or aromatic solvents, some of which are dangerous both to the user and the environment. They are furthermore characterized by variable quality and run lengths, depending on the skills of the plate-maker. Most of these additive systems require the presence of strong acids, masking aids, and inorganic particulates.

Solvent systems incorporating resins are further limited by the molecular weight of the resin that can be put into solution, fifty thousand Daltons being generally the upper limit. Thus more durable, high molecular weight resins cannot be used. Conventional subtractive photopolymer plates require relatively high energy inputs (e.g., on the order of $10^7$ ergs per $cm^2$) to effect the necessary chemical reaction. Most of these systems incorporate complex organic solvent/water miscible developers which are often environmentally dangerous.

The present invention represents a marked departure from prior conventional plate making systems. The present invention provides an improved plate and process which is characterized by total aqueous development, quick, low energy imaging (e.g., on the order of $10^4$ ergs per $cm^2$), and an extremely tough, long-wearing oleophilic image.

SUMMARY

The lithographic printing plate of the invention comprises a substrate having a hydrophilic surface, a coating on said surface of a light sensitive material (e.g., a water soluble diazo) and a top coating of discrete, oleophilic resin particles (e.g., an emulsion polymer), the resin particle coating being:

(a) transparent to actinic light;
(b) sufficiently permeable to allow a developer for the light sensitive material to penetrate through to the underlying light sensitive coating;
(c) insoluble in said developer;
(d) capable of being coalesced in situ after the plate is imaged and developed.

DESCRIPTION

The lithographic printing plate in a preferred embodiment reinforced image which is formed by:

(a) providing a substrate having a hydrophilic surface, a coating on said surface of a water-soluble, light sensitive diazo material and a top coating on the diazo coating comprising discrete oleophilic resin particles, said top coating being transparent to actinic light and sufficiently permeable to allow an aqueous developer to penetrate through to the underlying diazo;

(b) selectively exposing the diazo coating to actinic light through the top coating whereby the light struck areas of the diazo become water insoluble and selectively adhered in said areas to the hydrophilic surface and the second coating;

(c) removing diazo material and overlying top coating from the non-light struck areas by applying an aqueous developer and rinsing with water to reveal the hydrophilic surface in the non-light struck areas;

(d) applying heat to the plate from step (c) sufficient to coalesce (i.e., fuse or harden) the resin particles adhered to the diazo in the light struck areas.

In a preferred embodiment, a suitable hydrophilic substrate such as silicated aluminum (U.S. Pat. No. 2,714,066, Jewett et al.) or anodized and silicated aluminum (U.S. Pat. No. 3,181,461, Fromson) is coated with a water-soluble diazo resin. The diazo is then overcoated with a permeable layer of discrete resin particles which are preferably laid down from an aqueous emulsion of resin particles (commonly referred to as emulsion polymers or emulsion polymerized resins) which is non-film forming at room temperature (in contrast to certain latex emulsion polymers such as those used in paints which form a polymer film at room temperature when the aqueous phase evaporates). When the aqueous phase is removed, discrete, finely divided particles of resin are distributed over the diazo layer in a layer which is at least one particle thick. In the case of one commercially available aqueous emulsion (e.g., "LYTRON-614" by Monsanto), the particles are high molecular weight spheroids of polystyrene with a molecular weight of about 500,000 Daltons or greater.

Because the resin particles are not film forming at room temperature, the layer remains porous or permeable to an aqueous developer which can reach the underlying diazo which remains water soluble in non-light struck areas. The resin particle layer is also transparent to actinic light.

The coated plate is selectively exposed (e.g. through a negative) to a source of actinic light of an intensity and for a time sufficient to at least partially degrade the diazo which becomes adherent to the substrate and the overlying resin particles in the light struck or image areas.

The imaged plate is then developer by contacting it with an aqueous developer which permeates the resin particle layer and removes diazo (and the overlying resin particles without, however, disolving the particles) from the non-light struck or background areas. It is preferred to employ an aqueous anionic developer to insure complete removal of diazo from the background areas to reveal a clean, hydrophilic surface provided by the substrate in the background. This is described in more detail below.

The developed plate, with resin particles on top of the light struck diazo image areas is then heated to coalesce the resin particles in situ and provide a tough wear resistant image. In the case of polystyrene particles, it is sufficient to exceed the minimum film forming temperature (MFT) to fuse the particles into a tough protective oleophilic (ink-loving) film which is formed in situ after the plate is imaged and developed. The same applies to other suitable thermoplastic resin particles. In the case of a thermosetting resin, heating hardens the particles into a continuous oleophilic film.

The resin-reinforced image is virtually indestructable, far exceeding the cohesion, adhesion and abrasion resistance of any known organic lithographic image.

The preferred method for removing diazo and the overlying resin particle layer from the non-light struck areas involves the use of an aqueous anionic material which insures a clean, hydrophilic background.

As described in copending applications Ser. No. 274,342, filed June 17, 1981, U.S. Pat. No. 4,414,315 and Ser. No. 274,341, filed June 17, 1981, U.S. Pat. No. 4,391,897, it has been found that diazo resin, which is cationic and positively charged, will chemically couple with an anionic material, such as sodium lauryl sulfate, in water, and the coupled product dissolves in the aqueous anionic solution. In the present invention, the aqueous anionic solution particles) and functions in the same manner with respect to non-light struck diazo material to reveal a clean, hydrophilic background. Thus, is a preferred embodiment, the diazo in the non-light struck areas is coupled with an anionic material to remove diazo and overlying resin particle layer from the non-light struck areas (without dissolving the resin particles) by contacting the substrate after exposure with an anionic material in water in a quantity and for a time sufficient to couple the anionic material with diazo and dissolve the coupled product from the non-light struck areas and rinsing with water to reveal the hydrophilic surface in the non-light struck areas. It is preferred to overwhelm the exposed surface with aqueous anionic material to couple the diazo and dissolve the coupled product from the non-light struck areas of the plate. This can be accomplished by immersion in the aqueous solution or by flooding the exposed surface by cascading or spraying. Rubbing by hand, normally employed with conventional developers is not necessary and should be avoided to prevent removal of resin particles adhered to the diazo in the light struck areas and the creation of conditions under which the coupled product will come out of solution in the developer and deposit in the background.

It is necessary to only briefly expose a plate of the invention to actinic light in order to render light struck diazo in the image area water insoluble and adhered to both the underlying hydrophilic surface and the overlying resin particle layer in such areas. Thus, short exposures on the order of seconds (e.g., 5 to 10 seconds) can be employed. This is in contrast to much longer exposure times (on the order of a minute or more) normally used with diazo materials.

The hydrophilic substrate can be a single sheet or a laminate, rigid or flexible. The preferred lithographic substrate is aluminum and especially anodized aluminum which may be pretreated before anodizing to roughen or grain the surface, for example using mechanical, chemical or electrochemical techniques as are well known in the art and it may be post-treated after anodizing. It is preferred to grain aluminum using the process of U.S. Pat. No. 4,183,788 issued June 15, 1980, to Fromson and Gracia and to impart hydrophilicity by silicating anodized aluminum as described in Fromson U.S. Pat. No. 3,181,461 or by silicating aluminum as described in Jewett et al. U.S. Pat. No. 2,714,066.

Light sensitive, water-soluble diazonium materials used in the invention have reactive sites which are capable of being chemically altered by light to adhere the diazo to the hydrophilic substrate and the overlying resin particle layer in light struck areas. In a preferred embodiment, the diazo is also capable of being chemically reacted with an anionic material to remove diazo from non-light struck aras. For example, 4-diazo diphenylamine condensed with a carbonyl compound such as formaldehyde has these reactive sites each having this dual functionality. Such a condensed diazo compound further coupled with an aromatic compound such as the sulphonic acid of benzophenone to make it water insoluble is only light sensitive and cannot undergo chemical reaction with an anionic material. Suitable diazonium compounds are described, inter alia, in U.S. Pat. Nos.

2,063,631, 2,667,415, 2,679,498, 3,050,502, 3,311,605, 3,163,633, 3,406,159, and 3,227,074.

Anionic materials suitable for use in a preferred embodiment of the invention are water soluble and include the alkali metal salts of alkylaryl sulfonates having 1 to 20 carbon atoms in the alkyl portion and 6 to 14 carbon atoms in the aryl portion, alkali metal salts of alkyl sulfonates having 12 to 20 carbon atoms and ammonium and alkali metal salts of sulfated higher fatty alcohols having 10 to 20 carbon atoms. Anionic materials are dissolved in water and the concentration of the anionic material is sufficient to dissolve the coupled reaction product between the diazo and anionic materials.

The effectiveness of certain anionic materials can be improved by adjusting the pH in the range of 2–10, preferably 2.5–9. While a pH adjuster can be present, the presence of other materials such as cationic materials that will interfere with or prevent the coupling reaction between the diazo and the anionic material in the non-light struck areas and dissolution of the coupled material from such areas, must be avoided.

Many different salts of anionic materials are suitable; these include sodium, lithium, ammonium, or triethanol amine salts and the like. Examples of suitable anionic surfactants (and their commercial sources) are as follows:
1. Sodium lauryl sulfate (Proctor & Gamble, Equex S. Equex SP; Alcolac, Inc. Sipex SB).
2. Ammonium lauryl sulfate (Alcolac, Inc., Sipon L-22).
3. Sodium lauryl ether sulfate (Alcolac, Inc., Sipon ES).
4. Sodium dodecyl benzene sulfonate (Alcolac, Inc. Siponate DS-XO).
5. Ammonium lauryl ether sulfonate (Alcolac, Inc. Sipon EA).
6. Triethanolamine lauryl sulfate (Alcolac, Inc. Sipon LT-6).
7. Sodium alkyl sulfate (Alcolac, Inc., Sipex OLS).
8. Sodium stearate (Emery Inds.).
9. Sodium palmitate (Emery Inds.).
10. Sodium oleate (Matlerson, Coleman & Bell).
11. Dioctyl sodium sulfosuccinate (Cyanamid, Aerosol OT).
12. Tetrasodium N-Cl, 2 dicarboxyethyl 1)-N-octadecyl sulfosuccinate (Cyanamid, Aerosol 22).
13. Sodium Xylene sulfonate (Witco Chemical, Ultra SXS).
14. Sodium toluene sulfonate (Witco Chemical, Ultra STS).
15. Sodium cumene sulfonate (Witco Chemical, Ultra SCS hydrostrope).
16. Sodium dihexyl sulfosuccinate (Cyanamide Aerosol Ay-65).
17. Sodium diaml sulfosuccinate (Cyanamide Aerosol Ay-65).
18. Anionic phosphate surfactant (Rohm & Haas Co., Triton QS-30).
19. Sodium alkylaryl polyether sulfate (Rohm & Haas Co., Triton W-30 Conc.).
20. Phosphate surfactant, potassium salt (Rohm & Haas Co., Triton H-66).
21. Sodium alkylaryl polyether sulfonate (Rohm & Haas Co., Triton X-200).

Sodium lauryl sulfate is preferred because of its availability and cost.

As described in U.S. Pat. No. 4,277,555 issued July 7, 1981, cationic dyes can be applied to silicated aluminum or anodized and silicated aluminum or incorporated in the diazo to provide a visible image on the plate. Suitable dyes include basic cationic dyes such as Victoria Green, Rhodamine B, Rhodamine 5GLD, crystal violet, extra pure APN, Paper Blue R and the like.

When using an aqueous emulsion of resin particles to lay down the resin particle coating on the diazo, the solids content of the emulsion can range from as low as 1% up to 60% or more by weight. With a higher loading of solids, it may be necessary to adjust the pH of the anionic developer to insure complete removal of diazo from the non-light struck areas. The important thing is that the resin particle layer be sufficiently porous or permeable to allow the aqueous developer to reach the underlying diazo as quickly as possible after exposure of the plate.

Thermoplastic and thermosetting resins can be used for the resin particle layer. Suitable oleophilic thermoplastic resins include styrene homo- and copolymers (e.g., with acrylic acid), olefin homo- and copolymers and acrylic homo- and copolymers and the like. Emulsion polymerized resins are preferred. Suitable oleophilic thermosetting resins include phenolformaldehyde resins and the like. Virtually any oleophilic resin that can be fused (the minimum film forming temperature of a particular thermoplastic polymer or resin is designated MFT) or hardened in situ at temperatures above room temperature and up to 350° F. or higher can be used. The upper limit on heating will generally be a function of the material of the substrate and the lower limit a function of temperatures that will be encountered in shipping and storage of product.

Heating can be carried out by passing the plates through a heated pair of rollers, over a heated platten or under a source of radiant or IR heat.

Resin particle size is not critical and can range from about 0.03 microns up to about 2 microns. Larger size particles tend to provide a layer that is easily penetrated by a developer while smaller size particles provide a layer that is easier to coalesce.

In place of two layers, it is also possible to employ a mixture of diazo and resin particles in a matrix layer. The relative proportions must be such that each will function in the manner described herein for the two layer embodiment. Thus, the diazo component of the matrix will fill the spaces between the resin particles which would be contiguous or nearly contiguous with adjacent or surrounding particles. Diazo in the light struck areas would become adhered to the substrate and the resin particles and would be removed from the non-light struck areas as described herein. Heating would coalesce the resin particles to form a tough, wear-resistant oleophilic image surrounded by a clean, hydrophilic background.

The following examples will illustrate the invention without limiting same in any manner.

EXAMPLE 1

A brush grained anodized, silicated aluminum substrate was coated with a light sensitive diazonium resin, such as that produced by Fairmont Chemical Company, designated diazo resin #4. The coated substrate was then top coated with E-308 latex (Morton Chem. Co.) at 40% solids. The coated light sensitive substrate was then placed in a vacuum frame (Nu-Arc. 2000 watts Xeron) and exposed through a negative for ten seconds. The exposed plate was developed for ten seconds in a five percent solution of sodium lauryl sulfate at a pH of 2.5. The developed plate was dried and then post treated by heating in an oven at 350° F. for approximately 15 seconds. The post treatment fused the latex particles remaining on the image thus forming a continuous high gloss film that reinforces and protects the image while printing.

EXAMPLE 2

A brush grained substrate similar to that in Example 1 was coated with paradiazo diphenylamine condensate. This coating was then top coated with a 40% solids emulsion latex designated Lytron 614 (Monsanto Chem. Co.) The wet coating thickness was approximately 0.0015". The plate was exposed on a Nuc-Arc for five seconds through a negative. It was then developed in a 5% solution of sodium lauryl sulfate in water for approximately ten seconds at 125° F. After drying, the plate was heated to approximately 300° F. with a hot air gun. At this temperature the latex particles fuse and form a continuously adhered film over the image areas of the plate.

EXAMPLE 3

A smooth aluminum sheet, alloy 1100, 0.012" thick, was degreased, anodized, and silicated. The sheet was coated on a two roll coater with a 3% solution of diazo resin #4. The coated sheet was next overcoated with Lytron 5450 latex (Monsanto Chem. Co.) at 48% solids, pH 9, with a draw down bar at a wet coating thickness of 0.0015". The coated sheet was exposed for ten seconds and developed in a 5% sloution of sodium lauryl sulfate at a pH of 9.5. The sheet was dried whereupon a white opaque image was apparent. Next the image sheet was post treated by passing it through a PPG, UV exposure unit, at 12 ft/minute, with both 300 watt lamps on high power. It was readily seen as the image plate exits from the UV unit that the white, opaque image has fused to a transparent, hard, tough, glossy image that instantly repels water.

EXAMPLE 4

A chemically grained, anodized, silicated plate was coated with a two percent solution of a diazonium resin. The plate was then top coated at a wet coating thickness of approximately 0.0015", with a 24 percent solids solution of Lytron 614. After drying the plate was exposed for ten seconds, as in Example 2. The developed plate was then passed through a PPG unit as in Example 3. The results were similar in that a tough, ink receptive image results that is capable of printing thousands of copies on an offset press.

EXAMPLE 5

A brush grained plate prepared as in Example 1 was coated with a two percent solution of paradiazodiphenyl amine sulfate. The plate was top coated, exposed, developed, and post treated as in Example 3. The results were similar in that a tough ink receptive image results.

EXAMPLE 6

A brush grained plate prepared as in Example 1 was coated with a 2 percent solution of diazo resin #4. The plate was the top coated with a 20 percent solids dispersion of Conrez (Morton Chem. Co.) on a two roll coater. The coated plate was dryed, exposed, developed, and post treated as in Example 3. A tough ink receptive image results that prints clean high quality images on an offset press.

EXAMPLE 7

A plate substrate 28⅛"×13⅜"×012" prepared as in Example 1 was coated with a 2 percent solution of diazo resin #4 on a two roll coater. The plate was then top coated on a two roll coater with a 12 percent solution of Lytron 5450. The coated plate was then exposed for ten seconds through a newspaper negative, developed in 5 percent sodium lauryl sulfate and post treated as in Example 3. The resulting fused plate was placed on a Goss metro newspaper press for one hundred thousand good impressions.

We claim:
1. Process for making a lithographic printing plate which comprises:
   (a) providing a substrate having a hydrophilic surface and a coating on said surface of a water-soluble, light sensitive diazo material;
   (b) applying to the diazo coating a top coating comprising discrete oleophilic resin particles, said top coating being transparent to actinic light and sufficiently permeable to allow an aqueous developer to penetrate through to the underlying diazo coating;
   (c) selectively exposing the diazo coating to actinic light through the top coating whereby the light struck areas of the diazo become water insoluble and selectively adhered in said areas to the hydrophilic surface and the top coating;
   (d) removing diazo material and overlying top coating from the non-light struck areas by applying a developer consisting essentially of water and an anionic material to reveal the hydrophilic surface in the non-light struck areas;
   (e) applying heat to the plate from step (d) sufficient to coalesce in situ the resin particles adhered to the diazo in the light struck areas.

2. Process of claim 1 wherein the hydrophilic substrate is silicated aluminum.

3. Process of claim 1 wherein the hydrophilic substrate is anodized and silicated aluminum.

4. Process of claim 1 wherein the coating of resin particles comprises themoplastic particles which are fused in situ by applying energy.

5. Process of claim 4 wherein the coating of resin particles are selected from the group of particles of styrene homo- and copolymers and acrylic homo- and copolymers.

6. Process of claim 1 wherein the coating of resin particles comprises themosetting particles which are hardened in situ by applying heat.

7. Process for making a lithographic printing plate which comprises:
   (a) providing a substrate having a hydrophilic surface and a coating on said surface of a water-soluble, light sensitive diazo material;
   (b) applying to the diazo coating a top coating comprising discrete oleophilic resin particles, said top coating being transparent to actinic light and sufficiently permeable to allow an aqueous developer to penetrate through to the underlying diazo coating;
   (c) selectively exposing the diazo coating to actinic light through the top coating whereby the light struck areas of the diazo become water insoluble and selectively adhered in said areas to the hydrophilic surface and the top coating;
   (d) coupling diazo material in the non-light struck areas with an anionic material to remove diazo and overlying top coating from the non-light struck areas by contacting the substrate after exposure with a developer consisting essentially of an anionic material in water in a quantity and for a time sufficient to couple the anionic material with diazo and dissolve the coupled product from the non-light struck areas to reveal the hydrophilic surface in the non-light struck areas;

(e) applying heat to the plate from step (d) sufficient to coalesce in situ the resin particles adhered to the diazo in the light struck areas.

8. Process of claim 7 wherein the anionic material is an anionic surfactant.

* * * * *